United States Patent
Pfeuffer et al.

(10) Patent No.: US 12,059,881 B2
(45) Date of Patent: Aug. 13, 2024

(54) INTERBONDED COMPONENTS, METHOD FOR DETACHING COMPONENTS FROM INTERBONDED COMPONENTS, AND METHOD FOR PRODUCING INTERBONDED COMPONENTS

(71) Applicant: OSRAM Opto Semiconductors GmbH, Regensburg (DE)

(72) Inventors: Alexander Pfeuffer, Regensburg (DE); Korbinian Perzlmaier, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 120 days.

(21) Appl. No.: 17/766,622

(22) PCT Filed: Oct. 5, 2020

(86) PCT No.: PCT/EP2020/077880
§ 371 (c)(1),
(2) Date: Apr. 5, 2022

(87) PCT Pub. No.: WO2021/069388
PCT Pub. Date: Apr. 15, 2021

(65) Prior Publication Data
US 2023/0321970 A1    Oct. 12, 2023

(30) Foreign Application Priority Data
Oct. 7, 2019   (DE) .......................... 102019126862.1

(51) Int. Cl.
*H01L 21/683*    (2006.01)
*B32B 43/00*    (2006.01)

(52) U.S. Cl.
CPC ........ *B32B 43/006* (2013.01); *H01L 21/6835* (2013.01); *H01L 2221/68304* (2013.01); *H01L 2221/68318* (2013.01); *H01L 2221/68322* (2013.01); *H01L 2221/68354* (2013.01)

(58) Field of Classification Search
CPC ........ H01L 21/6835; H01L 2221/6834; H01L 2221/683148; H01L 2221/68322; H01L 2221/68354
See application file for complete search history.

(56) References Cited

U.S. PATENT DOCUMENTS

| | | | |
|---|---|---|---|
| 10,411,155 B2 | 9/2019 | Zini et al. | |
| 11,276,603 B2 | 3/2022 | Choi et al. | |
| 2010/0151627 A1 | 6/2010 | Kim et al. | |
| 2015/0028362 A1 | 1/2015 | Chan et al. | |

FOREIGN PATENT DOCUMENTS

| | | |
|---|---|---|
| DE | 102014110884 A1 | 2/2016 |
| KR | 20190076690 A | 7/2019 |

*Primary Examiner* — David A Zarneke
(74) *Attorney, Agent, or Firm* — Slater Matsil, LLP

(57) ABSTRACT

In an embodiment a component assembly includes a plurality of components, a carrier, wherein the components are secured on the carrier by a connecting layer, wherein, for each component, the connecting layer forms at least one supporting structure at which the connecting layer is adjacent to the component, and a sacrificial layer arranged regionally between the components and the connecting layer, wherein one portion of the components is assigned to a first group, wherein a further portion of the components is assigned to a second group, and wherein the components of the first group are different than the components of the second group in respect of a coverage with the sacrificial layer.

14 Claims, 19 Drawing Sheets

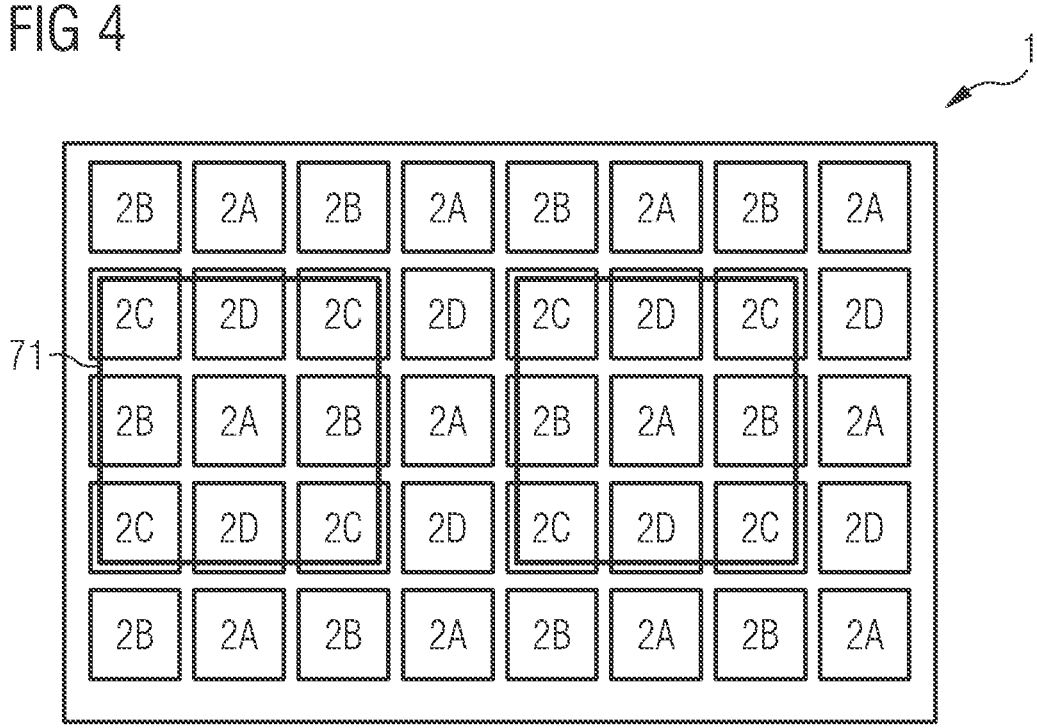

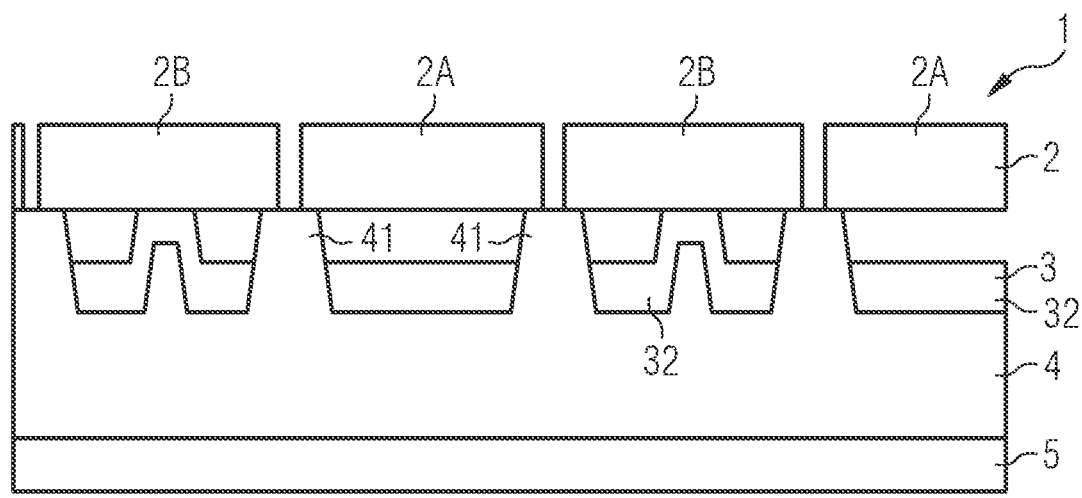
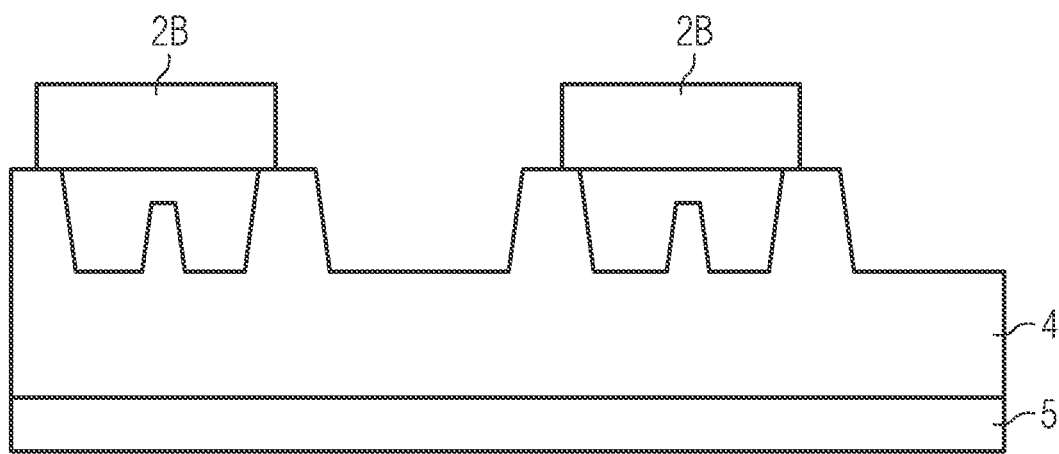

INTERBONDED COMPONENTS, METHOD FOR DETACHING COMPONENTS FROM INTERBONDED COMPONENTS, AND METHOD FOR PRODUCING INTERBONDED COMPONENTS

This patent application is a national phase filing under section 371 of PCT/EP2020/077880, filed Oct. 5, 2020, which claims the priority of German patent application 10 2019 126 862.1, filed Oct. 7, 2019, each of which is incorporated herein by reference in its entirety.

TECHNICAL FIELD

The present application relates to a component assembly comprising a multiplicity of components, to a method for detaching components from a component assembly and to a method for producing a component assembly.

BACKGROUND

For the production of electronic or optoelectronic devices, the components to be processed may be provided on a carrier and transferred into the respective devices. With increasing miniaturization of the components, however, the demands on the transfer process are also increasing, for example in respect of the positioning accuracy.

SUMMARY OF THE INVENTION

Embodiments provide improved reliability of the transfer of components.

A component assembly comprising a multiplicity of components is provided, the components being arranged on a carrier.

The components are for example electronic, microelectromechanical or optoelectronic components, for instance light-emitting diodes. An edge length of the components is, for example, at most 100 µm or at most 50 µm. For example, the edge length is between 4 µm inclusive and 30 µm inclusive.

According to at least one embodiment of the component assembly, the components are secured on the carrier by means of a connecting layer. The connecting layer is, in particular, locally adjacent directly to the components. Furthermore, the connecting layer is for example adjacent directly to the carrier. Nevertheless, one or more layers may be present between the connecting layer and the components and/or between the carrier and the connecting layer. The connecting layer may fully cover the carrier in a plan view of the component assembly.

According to at least one embodiment of the component assembly, for each component, the connecting layer forms at least one supporting structure at which the connecting layer is adjacent to the component. The supporting structure is adapted to mechanically support the respectively assigned component. For example, each component is assigned precisely one supporting structure. For example, the supporting structure overlaps with the centroid of the associated component in a plan view of the component assembly. A supporting structure may, however, also overlap with two or more components in a plan view of the component assembly. In this case, two or more supporting structures are expediently assigned to each component.

According to at least one embodiment of the component assembly, a sacrificial layer is arranged regionally between the components and the connecting layer. The sacrificial layer is intended to be removed, for example by means of a chemical method, before the detachment of the components from the component assembly. The supporting structures are for example respectively surrounded by the sacrificial layer in the lateral direction, in particular along their entire circumference.

A direction which extends parallel to a principal extent plane of the component assembly is regarded as a lateral direction.

According to at least one embodiment of the component assembly, one portion of the components is assigned to a first group and a further portion of the components is assigned to a second group. In particular, the components of the first group and the components of the second group are of the same type per se. This means that the components of the one group do not themselves differ in the framework of manufacturing tolerances from components of another group.

Expediently, all the components of the component assembly are assigned to precisely one of the groups. For example, the total number of groups is between two inclusive and six inclusive.

According to at least one embodiment of the component assembly, the components of the first group are different to the components of the second group in respect of a coverage with the sacrificial layer. In other words, the sacrificial layer is configured differently for components of the first group than for components of the second group. This is a deliberate difference, which goes beyond unintended manufacturing-related variations.

In particular, the sacrificial layer is configured so that the components of the first group can be detached with a predetermined detachment force after partial removal of the sacrificial layer, while components of the second group cannot yet be detached with the same detachment force. For example, the force required for detachment of the nondetachable components, for example for the components of the second group, would be greater by at least 20% or by at least 100% than the detachment force for detachment of the components of the first group.

Detachable components are in particular those for which, after this partial removal of the sacrificial layer, only the connecting layer remains in the vertical direction between the components and the carriers, particularly in a plan view over the entire base area of the respective components. In other words, at this stage only the connecting layer is still adjacent to the detachable components.

In at least one embodiment of the component assembly, the component assembly comprises a multiplicity of components and a carrier, the components being secured on the carrier by means of a connecting layer. For each component, the connecting layer forms at least one supporting structure at which the connecting layer is adjacent to the component. A sacrificial layer is arranged regionally between the components and the connecting layer. One portion of the components is assigned to a first group and a further portion of the components is assigned to a second group. The components of the first group are different to the components of the second group in respect of a coverage with the sacrificial layer.

In contrast to a component assembly in which the sacrificial layer extends uniformly over all the components, the sacrificial layer can be removed in a multistep method so that only components of the first group are detachable after a first step of the material removal of the sacrificial layer. Further material of the sacrificial layer may subsequently be removed in order to make the components of the second group and iteratively, if applicable, components of further groups detachable. The component assembly is thus adapted for a multistep transfer process in which, in particular, the material of the sacrificial layer is removed in at least two steps, components, for example all the components of the first group, already being transferred between these two steps.

According to at least one embodiment of the component assembly, the components of the first group are arranged in a regular pattern. Expediently, the components of the second group and, if applicable, the components of further groups are also arranged in a regular pattern.

According to at least one embodiment of the component assembly, the components have a base area with a polygonal base shape. For example, the base area is triangular or quadrilateral, in particular rectangular. In this context, a polygonal base shape means in particular that vertices of the base shape may be rounded. The base shape may also comprise more than four vertices. For example, the nearest neighbors of a component of the first group along all edges of this component do not belong to the first group of components.

According to at least one embodiment of the component assembly, at least some components of the first group only have nearest neighbors which do not belong to the first group of components along two mutually perpendicular spatial directions. For example, the component assembly comprises precisely two groups of components, which are respectively arranged alternately along two mutually perpendicular spatial directions. In other words, the components of the first group and the components of the second group are arranged in a checkerboard fashion.

According to at least one embodiment of the component assembly, at least some components of the first group are surrounded along the entire circumference by nearest neighbors which do not belong to the first group of components. Expediently, in a similar way, at least some components of the second group are surrounded along the entire circumference by nearest neighbors which do not belong to the second group of components. For example, the components of the component assembly are subdivided into four groups, the components of the four groups being arranged alternately in such a way that all the components of one group are surrounded along the entire circumference by nearest neighbors which do not belong to this group of components. At least some components means, for example, respectively at least 50% or at least 80% of the components of the respective groups.

According to at least one embodiment of the component assembly, the components of the first group and of the second group differ in respect of an average thickness of the sacrificial layer between the respective components and the carrier, for example by at least 10% of the thickness in relation to the thickness of the sacrificial layer between the components of the first group and the carrier.

The thickness in this case relates to the extent of the sacrificial layer in the vertical direction, i.e. perpendicularly to the principal extent plane of the component assembly. By means of the thickness of the sacrificial layer, it is possible to adjust how rapidly the material of the sacrificial layer can be removed at the respective position by a chemical process. A material erosion rate in the lateral direction may be greater for thicker sacrificial layers than for thinner sacrificial layers, or vice versa. For example, the etching rate increases in the lateral direction with an increase in the layer thickness when the etching process takes place in a diffusion-controlled fashion. In this case, the etching speed is substantially determined by the material transport. In a reaction-controlled regime, the chemical reaction per se determines the etching speed, so that thin layers are etched more rapidly than thicker layers.

According to at least one embodiment of the component assembly, the sacrificial layer comprises a first partial layer with a first material composition and a second partial layer with a second material composition different to the first material composition. The components of the first group and the components of the second group differ from one another in respect of a coverage with material of the first partial layer. For example, at least one material constituent is present with a proportion of at least 10 wt % more in the first material composition than in the second material composition.

For example, material of the first partial layer can be removed by means of a particular etching method with a higher erosion rate than material of the second partial layer. In this case, components of a group for which the coverage with the first partial layer is greater than for another group can be detached earlier than components of this other group.

Correspondingly, material of the sacrificial layer below the first group of components may already be removed fully when so much material of the sacrificial layer is still present below components of the other group, or other groups, that these components cannot be detached.

According to at least one embodiment of the component assembly, an island, which is surrounded along its lateral circumference to at least 80% or to at least 90%, for example fully, by the second partial layer, is formed by means of the first partial layer. In the lateral direction, material of the island is thus removable only when the second partial layer has already been removed along its circumference. For example, the island is surrounded by an enclosing subregion of the second partial layer.

A method for detaching components from a component assembly is furthermore provided. To this end, in particular, a component assembly which has at least one of the above-described features of the component assembly is provided.

Features described in connection with the component assembly may therefore also be employed for the method for detaching components, and vice versa.

According to at least one embodiment of the method, the method comprises a step in which material of the sacrificial layer is regionally removed. After this step, material of the sacrificial layer is thus still present. For example, the material of the sacrificial layer is removed in such a way that the components of the first group can be detached.

According to at least one embodiment of the method, at least one component of the first group is detached. In particular, all the components of the first group are detached. The components of the second group cannot yet be detached at this time.

For a group of components, "nondetachable" in this context means in particular that the detachment force with which the components of the first group are detached as intended is not yet sufficient for detachment of components of this group.

According to at least one embodiment of the method, the method comprises a step in which further material of the sacrificial layer is removed. This step is carried out, in particular, after all the components to be detached of the first group are already detached. For example, the further material of the sacrificial layer is removed in such a way that the components of the second group can be detached.

According to at least one embodiment of the method, the method comprises a step in which at least one component of the second group is detached.

The removal of the material of the sacrificial layer is thus carried out in a multistep process. In particular, further material of the sacrificial layer is removed at a time at which components are already detached from the component assembly.

According to at least one embodiment of the method, the components of the second group cannot be detached after the regional removal of material of the sacrificial layer and before the removal of further material of the sacrificial layer with a detachment force which is exerted for the detachment of the component of the first group. In other words, only the components of the first group are detachable before the removal of further material of the sacrificial layer.

According to at least one embodiment of the method, the detachment of the components is carried out by means of a transfer body. For example, the transfer body is a post of a plunger. Expediently, a plurality of components, in particular a plurality of components of the same group, are detached simultaneously.

According to at least one embodiment of the method, the transfer body has a base area which is at least 20% larger than a base area of one of the detached components. In other words, the transfer body is larger than the component to be detached in a plan view of the component assembly. Expediently, the base area of the transfer body is at most so large that the transfer body overlaps only with a component which can be detached at this time. In addition, the transfer body may overlap with one or more nondetachable components.

According to at least one embodiment of the method, a lateral principal extent axis of the transfer body is rotated with respect to a lateral principal extent axis of one of the detached components. For example, an angle between the principal extent axes is between 20° inclusive and 70° inclusive, in particular between 40° inclusive and 50° inclusive. In the case of quadrilateral components and transfer bodies, the principal extent axis is respectively the diagonal of the transfer body, or of the component. The transfer body and the component to be detached may however have other, for example other polygonal or at least locally curved, and in particular also mutually different, base shapes.

According to at least one embodiment of the method, the sacrificial layer comprises a first partial layer with a first material composition and a second partial layer with a second material composition different to the first material composition, the removal of material of the sacrificial layer before the detachment of the components of the first group being carried out by means of a chemical method which is selective with respect to the first and second material compositions. For example, material with the second material composition is not removed, or is only removed with a much lower erosion rate than material with the first material composition. By means of different materials for subregions of the sacrificial layer and associated selective etching methods, it is particularly reliably possible to achieve the effect that components of the first group are already detachable when components of the second group cannot yet be detached with the same detachment force.

As an alternative, the entire sacrificial layer may be formed from only one material composition. In this case, for example, it is possible to adjust by means of the local thickness of the sacrificial layer how high the erosion rate of material of the sacrificial layer in the lateral direction is at this position.

A method for producing a component assembly is furthermore provided. The described method is suitable particularly for the production of a component assembly as described above. Features described in connection with the component assembly may therefore also be employed for the method for producing the component assembly, and vice versa.

In at least one embodiment of the method, a multiplicity of components are provided. A sacrificial layer is formed on the components, a coverage with the sacrificial layer for components of a first group differing from that for components of a second group. The components are secured on a carrier by means of a connecting layer.

The method steps are preferably carried out in the order of the list mentioned above.

The components are, for example, provided on an initial carrier. This initial carrier may subsequently be removed, in particular after the components have been secured on the carrier.

The sacrificial layer is applied for example by means of a deposition method, for example by chemical vapor deposition (CVD) or physical vapor deposition (PVD), for instance by evaporation or sputtering. The sacrificial layer is thus locally adjacent directly to the components.

According to at least one embodiment of the method, the connecting layer is at least partially fluid at the time of securing the components. For example, material for the connecting layer is applied in the fluid state. In particular, material of the connecting layer may flow into recesses of the sacrificial layer and be directly adjacent to the components at these positions. The material for the connecting layer may optionally be cured subsequently.

According to at least one embodiment of the method, the sacrificial layer is formed by means of a first partial layer and a second partial layer, the first partial layer being lithographically structured before the second partial layer is applied. The second partial layer is, for example, likewise lithographically structured. For example, the structuring of the first partial layer and of the second partial layer are carried out in such a way that the first partial layer and the second partial layer overlap only locally. In this way, a sacrificial layer which has different thicknesses at different positions may be produced simply. In addition, the first partial layer and the second partial layer may differ from one another in respect of their material composition.

The application is based, in particular, on the concept that a multistep transfer process leads to a higher reliability overall. In particular, with the described configuration of the sacrificial layer the components may be configured to be only partially transferable during the transfer process so that in a first step only a defined portion, for instance the components of the first group, in a predetermined array is taken off. Once all the transferable components have been taken off, new components, i.e. components of the second group and, if applicable, iteratively components of further groups, may be made transferable by further removal of material of the sacrificial layer.

The risk that a neighboring component will become separated during the transfer of a component because of a misalignment of the transfer body is reduced.

Furthermore, the transfer body may have a greater lateral extent than the associated component to be removed. The method may thus also be carried out reliably for particularly small components.

The component assembly and the associated methods are suitable for example for optoelectronic components such as light-emitting diodes, for instance for the production of video walls, displays or projectors or for applications in so-called augmented reality. In principle, however, the components may also be other optoelectronic components such as detectors, purely electronic components or microelectromechanical components.

BRIEF DESCRIPTION OF THE DRAWINGS

Further configurations and expediencies may be found from the following description of the exemplary embodiments in conjunction with the figures, in which:

FIG. 4 shows an exemplary embodiment of a component assembly and of an associated detachment method with the aid of an intermediate step in a schematic plan view;

FIGS. 11A to 11C show an exemplary embodiment of a method for detaching components with the aid of intermediate steps respectively represented in a schematic sectional view;

Elements which are the same, or of the same type, or which have the same effect, are respectively provided with the same references in the figures.

The figures are respectively schematic representations and are therefore not necessarily true to scale. Rather, individual elements, and in particular layer thicknesses, may be represented as being exaggeratedly large for improved representation or for improved understanding.

DETAILED DESCRIPTION OF ILLUSTRATIVE EMBODIMENTS

Figure 1:
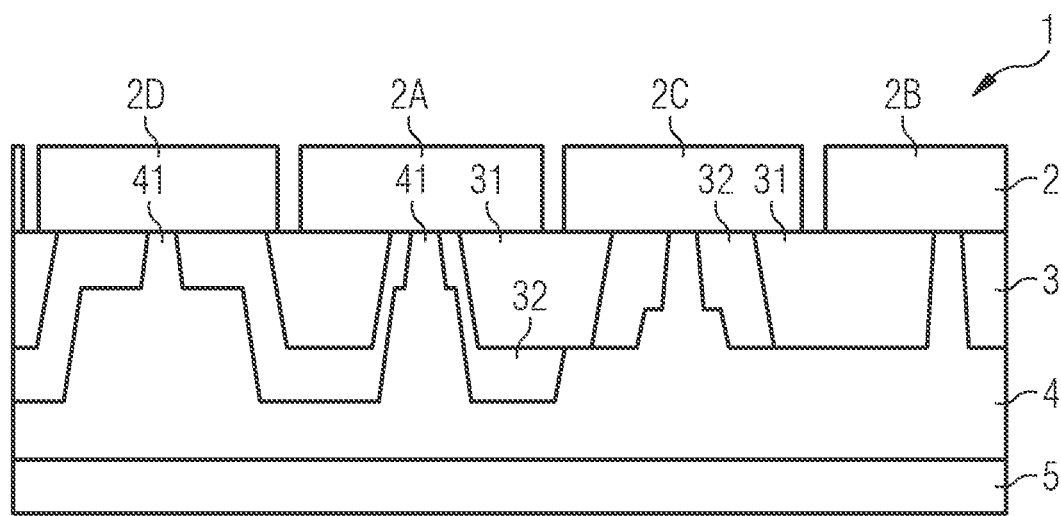
FIG. 1 shows an exemplary embodiment of a component assembly in a schematic sectional view.

FIG. 1 shows an exemplary embodiment of a component assembly 1 comprising a multiplicity of components 2. The figure shows a detail of the component assembly in a sectional view with four components 2, which are assigned by way of example to four groups of components. The components of a first group 2A, of a second group 2B, of a third group 2C and of a fourth group 2D are respectively secured on a carrier 5 of the component assembly by means of a connecting layer 4.

The connecting layer 4 respectively forms a supporting structure 41 for each component 2. The supporting structure 41 is arranged centrally with respect to the components 2, that is to say it overlaps with the respective centroid of the associated component 2 in a plan view of the component assembly 1.

The supporting structure 41 is respectively adjacent directly to the components 2. A sacrificial layer 3 is arranged locally between the connecting layer 4 and the components 2. The sacrificial layer 3 comprises a first partial layer 31 and a second partial layer 32. The first partial layer 31 and the second partial layer 32 overlap only locally with one another. This gives rise to regions in which the first partial layer 31 and the second partial layer are arranged above one another, for example between the components of the first group 2A and the carrier 5.

Only the first partial layer 3 of the sacrificial layer 3 is present between the component of the second group 2B and the carrier 5. Only the second partial layer 32 is present between the components of the fourth group 2D and the carrier 5. For the various components 2, this leads to a different coverage with the sacrificial layer 3 for the different groups of components in the form of different average layer thicknesses of the sacrificial layer 3. The first partial layer 31 and the second partial layer 32 are thus used, in particular, to form different average layer thicknesses below the various groups. The term "below" the components or the groups of components respectively refers to the region between the carrier and the corresponding components or groups of components.

The first partial layer 31 and the second partial layer 32 may, in this exemplary embodiment, be the same in respect of the material used.

For example, the sacrificial layer 3, the first partial layer 31 and/or the second partial layer 32 contain silicon, silicon nitride, silicon oxide, germanium, molybdenum or a spin-on-glass material.

In such a component assembly 1, the individual groups of components 2A, 2B, 2C, 2D may be configured to be detachable sequentially after one another.

Figure 2A:
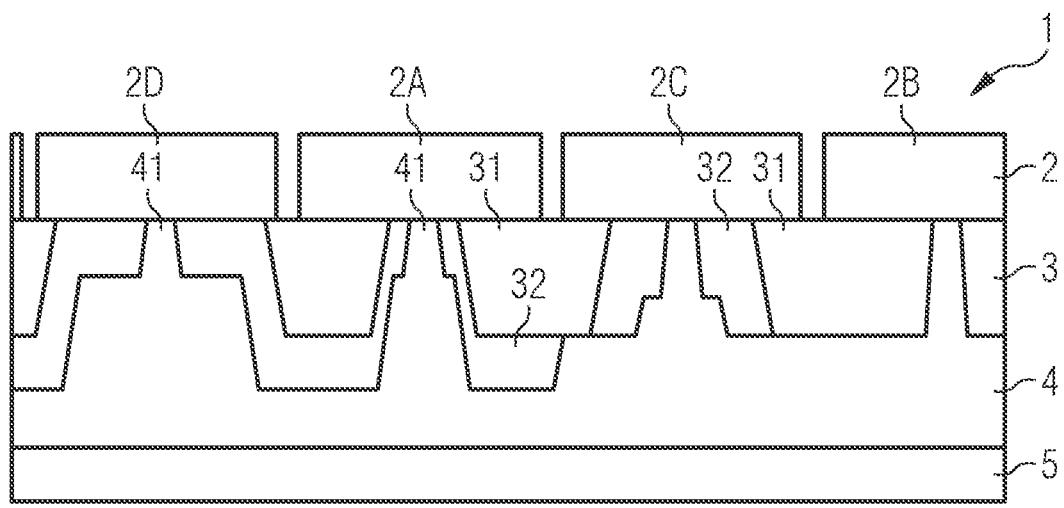
FIGS. 2A to 2F show an exemplary embodiment of a method for detaching components with the aid of intermediate steps respectively represented in a schematic sectional view.

This will become clear below with the aid of the exemplary embodiment described in FIGS. 2A to 2F. The provided component assembly 1 represented in FIG. 2A is configured as described in connection with FIG. 1. By the effect of a chemical method, for instance wet chemical or dry chemical etching, material erosion of the sacrificial layer 3 takes place starting from the intermediate spaces between the components 2. By lateral undercut etching of the components 2, the sacrificial layer adjacent to the components 2 is removed. When the etching process takes place in a diffusion-controlled fashion, the lateral undercut etching takes place commensurately faster when the thickness of the sacrificial layer 3 below the components 2 is greater. Accordingly, the components of the first group 2A are rid first of the sacrificial layer 3 on the side facing toward the carrier 5 and thereafter only bear on the supporting structure 41.

At this stage, the components of the first group 2A can be detached by means of a transfer body 7. For example, the transfer body 7 is a post 71 of a plunger 72. For example, polydimethylsiloxane is suitable as a material for the post.

In the following exemplary embodiments, one or more posts are respectively shown as examples of a transfer body. In principle, however, any other configuration of the transfer body is also suitable.

Figure 2B:
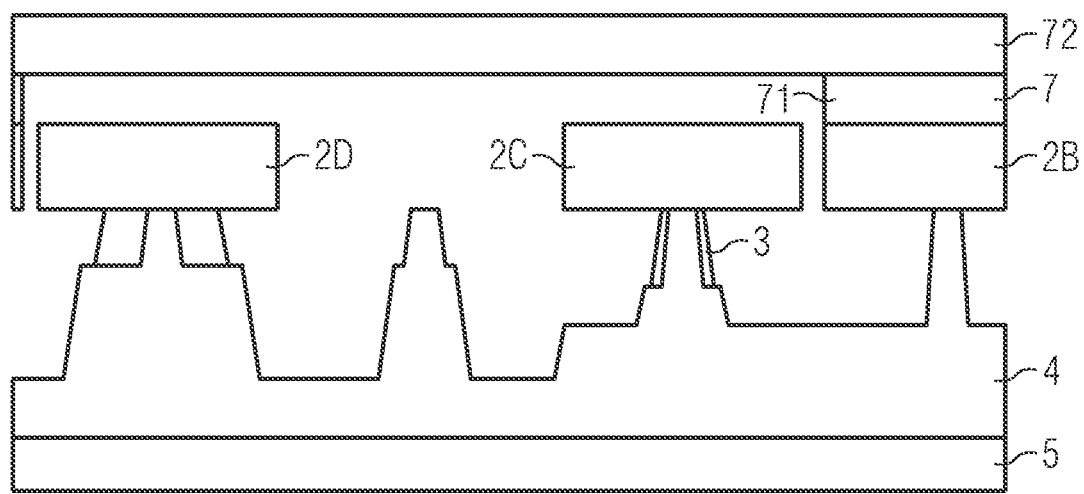

By subsequent removal of further material of the sacrificial layer 3, the components of the second group 2B can be made detachable. This method stage is illustrated in FIG. 2B. The transfer body 7 in the form of the post 71 overlaps with the component of the second group 2B and can lift it off. At this time, the components of the first group 2A are already removed.

Expediently, a plurality of components of a group are detached simultaneously. For example, the plunger 72 comprises a multiplicity of posts, the posts respectively overlapping with components of precisely one group of components.

Figure 2C:
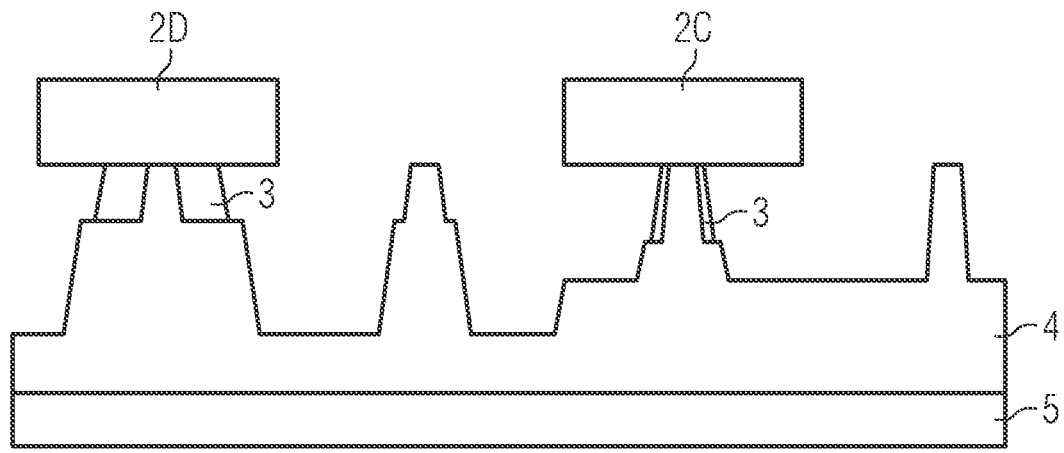

After detachment of all the components of the first group 2A and of the second group 2B, only the components of the third group 2C and of the fourth group 2D are still present (FIG. 2C). Residues of the sacrificial layer 3 are still located below these components, so that these components are not yet detachable.

Figure 2D:
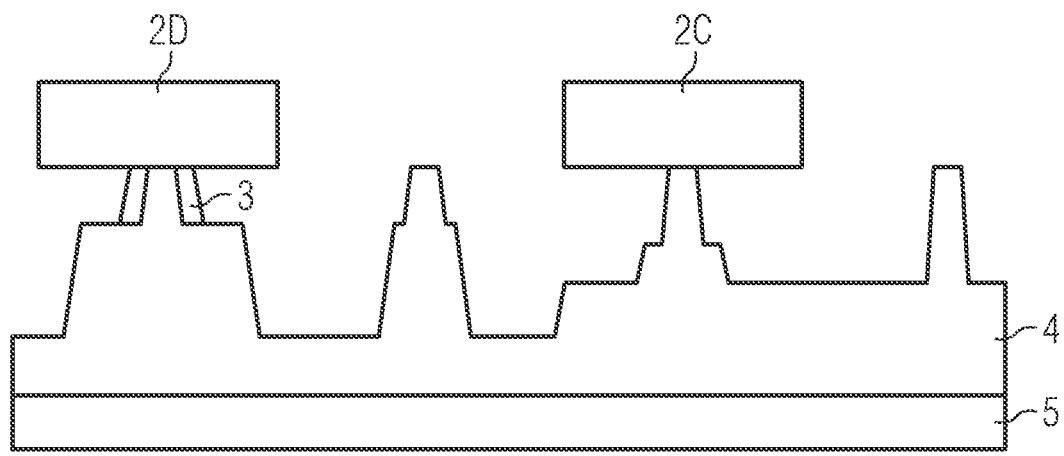

In a subsequent etching step, further material of the sacrificial layer 3 is removed until no material of the sacrificial layer is present any longer below the components 2 of the third group 2C (FIG. 2D). There is, however, still material of the sacrificial layer 3 below the components of the fourth group 2D, so that these components are not yet detachable.

Figure 2E:
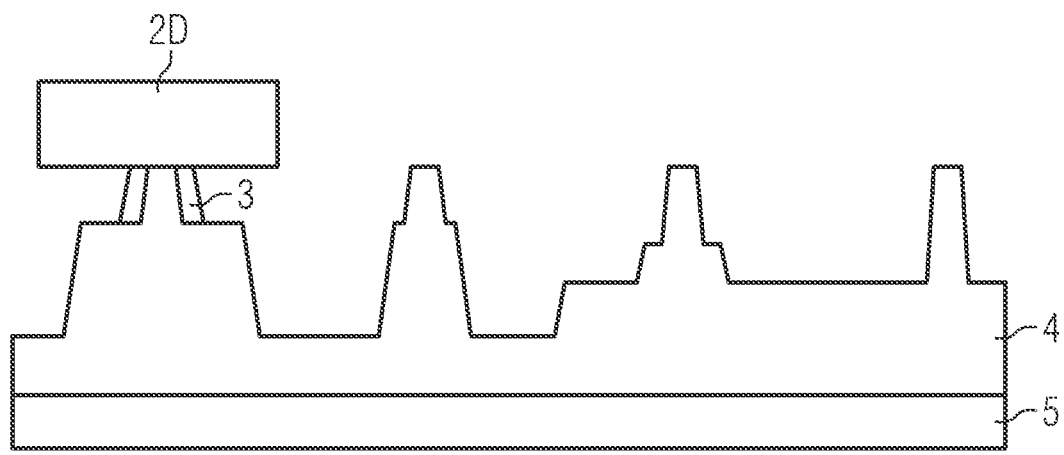
Figure 2F:
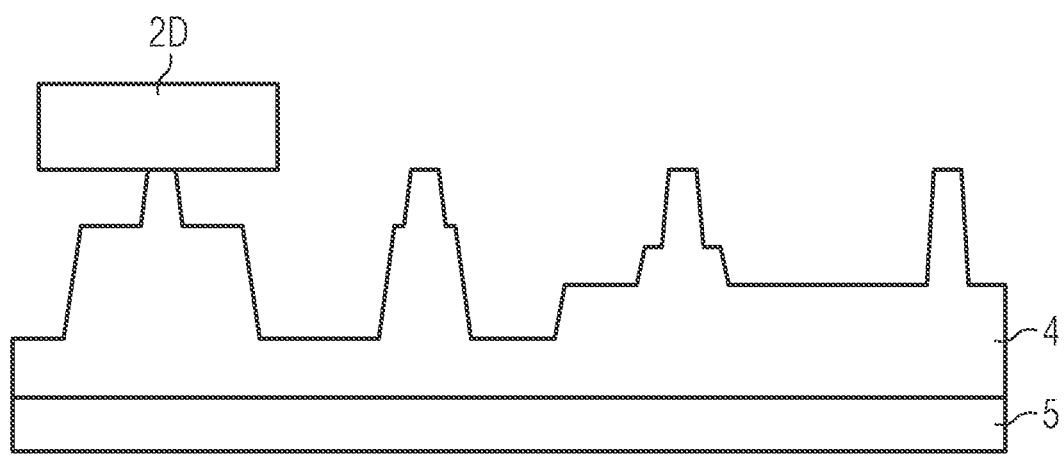

After the detachment of the components of the third group 2C, only the components of the fourth group 2D still remain (FIG. 2E). By a further etching step, the sacrificial layer 3 is also fully removed below the components of the fourth group 2D, so that the components of the fourth group are now detachable (FIG. 2F).

The removal of the sacrificial layer 3 is thus carried out in a multistep process, components of a group respectively being removed between two etching steps. Of course, an etching step may in this case comprise two or more substeps. In general, in the presence of n groups of components, n etching steps between which in particular components are respectively detached are thus carried out.

With the described method, the components may be configured to be detachable sequentially, so that the components to be detached are respectively surrounded at most by components which are not yet detachable at the respective method stage. This reduces the risk of maladjustment of the transfer body 7 in the transfer step accidentally leading to detachment of a neighboring component.

Figure 14A:
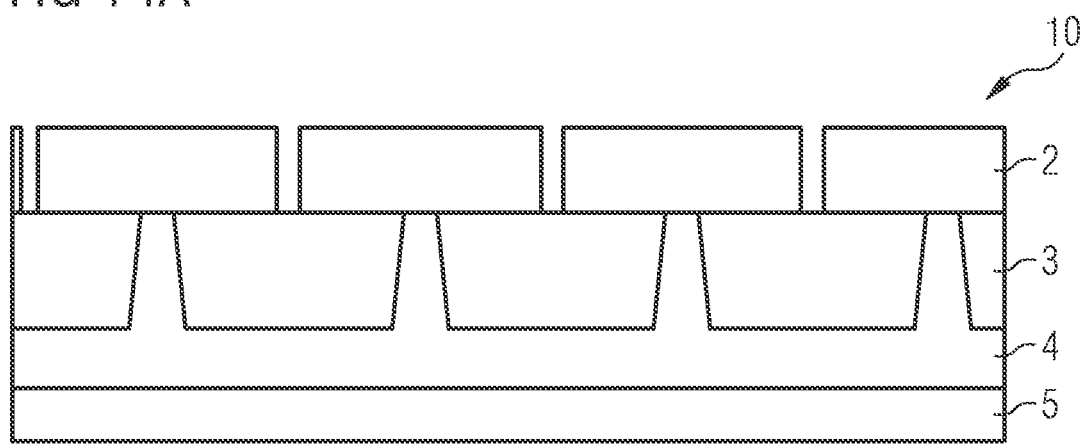
FIGS. 14A to 14D show a reference example of a method for detaching components.
Figure 14B:
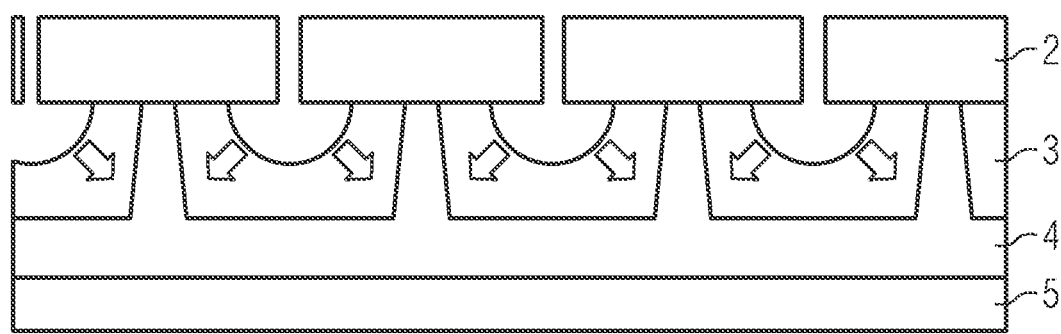
Figure 14C:
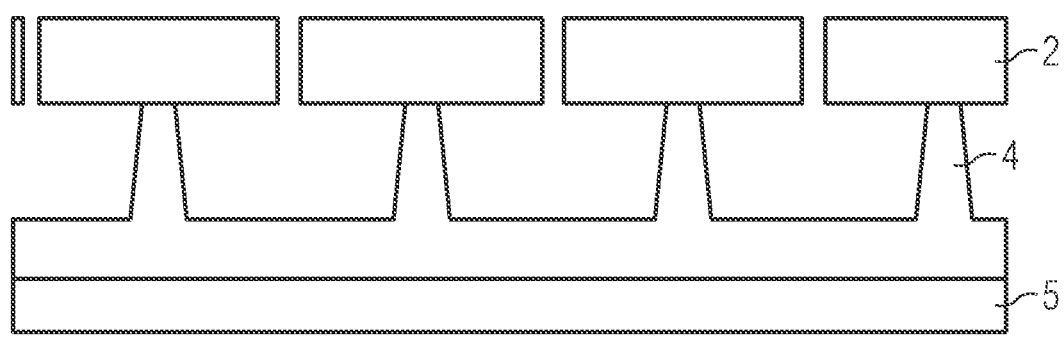
Figure 14D:
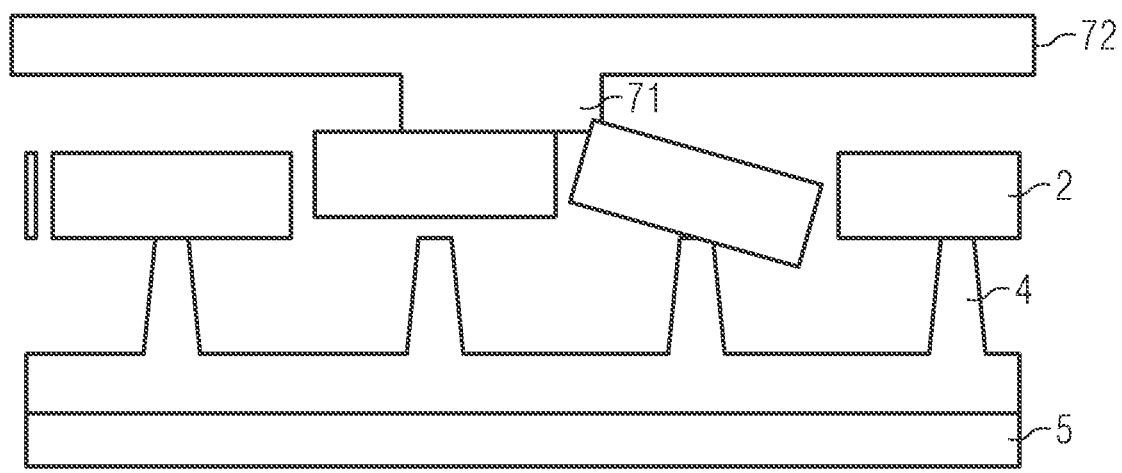

In comparison therewith, FIGS. 14A to 14D show a reference method starting with a reference assembly 10. In this reference assembly, the sacrificial layer 3 is configured identically below all the components 2. By etching of the sacrificial layer, schematically represented in FIG. 14B, uniform removal of the sacrificial layer 3 takes place over all the components 2, so that all the components 2 are detachable (FIG. 14C). In this case, a minor maladjustment of the post 7 may lead not only to the component actually intended being removed, but also to the neighboring component being taken up by the post 71.

Figure 3A:
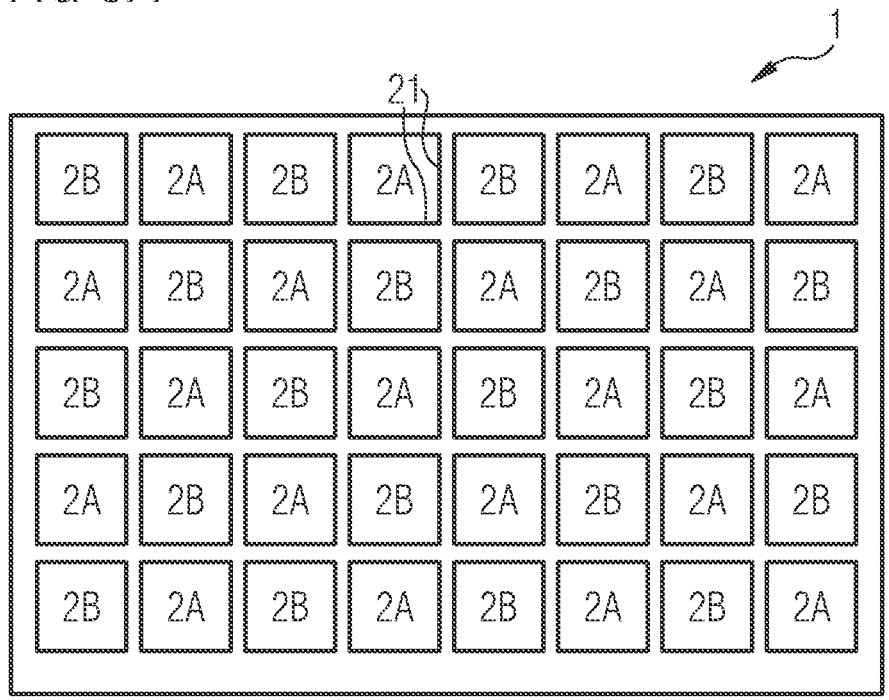
FIGS. 3A to 3D show an exemplary embodiment of a component assembly (FIG. 3A) and associated exemplary embodiments of a detachment method with the aid of an intermediate step, respectively in a schematic plan view.

FIG. 3A shows an exemplary embodiment of a component assembly 1 comprising a first group 2A and a second group 2B of components. The components are respectively arranged in a regular pattern. Exclusively components of the second group 2B are respectively adjacent to the components of the first group 2A along the edges 21. The components of the first group 2A and the components of the second group 2B thus form a checkerboard arrangement.

Figure 3B:
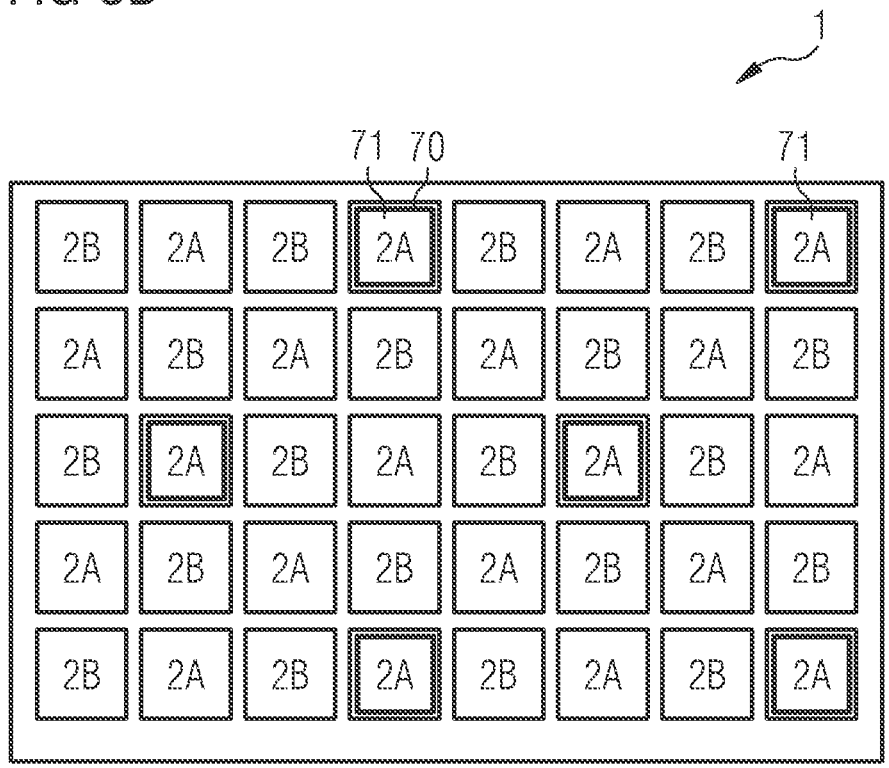

As represented in FIG. 3B, a base area 70 of the post 71 may have substantially the same size as the component to be detached of the first group 2A.

The transfer body may, however, also have a larger base area than the component to be detached if the transfer body overlaps only with precisely one detachable component. By means of enlarging the base area, the reliability of the detachment is increased, in particular for particularly small components.

Figure 3C:
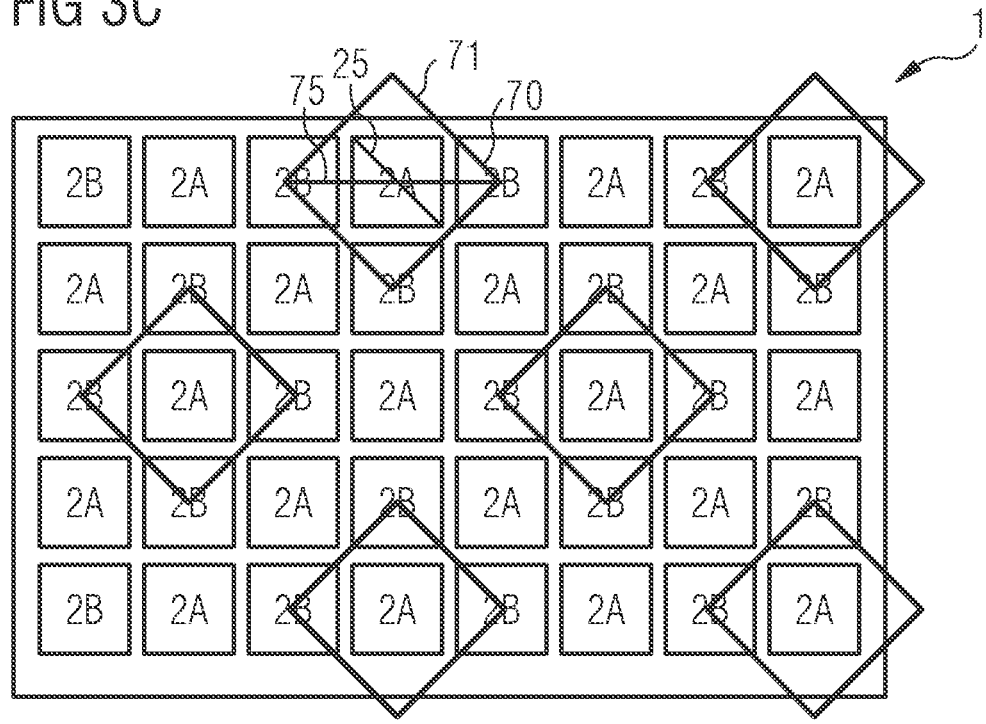

In the exemplary embodiment represented in FIG. 3C, a lateral principal extent axis 75 of the post 71 is rotated in relation to a lateral principal extent axis 25 of the component of the first group 2A, for example by 45°. The base area of the transfer body may be approximately doubled by this rotation, without a transfer body simultaneously overlapping with two detachable components, for example two components of the first group 2A.

In the exemplary embodiment shown, the components 2 and the transfer bodies in the form of the posts 71 are respectively configured with a square base shape. Other base shapes may however also be employed, for example other polygonal base shapes, for instance triangular or quadrilateral or hexagonal base shapes, or regionally curved base shapes, for instance circular or elliptical base shapes. Furthermore, the base shapes for the transfer body 7 and the component 2 to be detached may be different to one another.

Figure 3D:
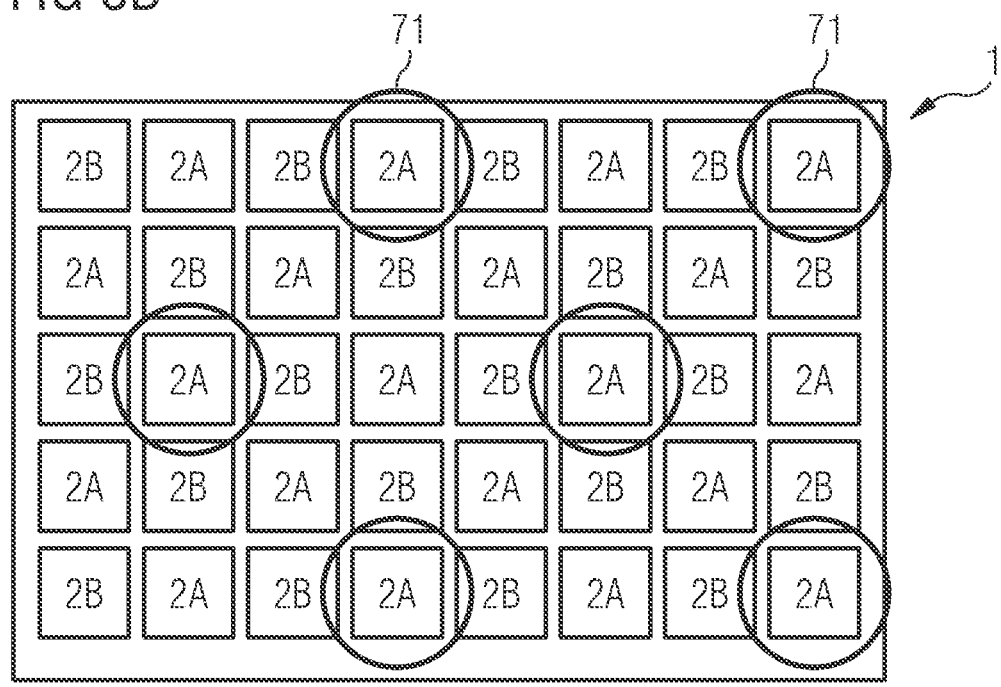

For example, FIG. 3D shows an exemplary embodiment in which the transfer body is configured in the form of a circular post 71. Compared with a square transfer body which is oriented relative to the components as shown in FIG. 3A, in this case the area of the transfer body is increased by the factor $\pi/2$.

In the exemplary embodiment shown in FIG. 4, the components of the component assembly 1 are assigned to a first group 2A, a second group 2B, a third group 2C and a fourth group 2D. Along every second row, the components of the first group 2A and of the second group 2B are arranged alternately. Along the rows between them, the components of the third group 2C and of the fourth group 2D are arranged alternately. This leads to an arrangement in which each component of a group, for example a component of the first group 2A, is surrounded exclusively by components which are assigned to other groups, for example the second group 2B, the third group 2C and the fourth group 2D. With such an arrangement, the base area of the transfer body 7, for example of the post 71, may be about nine times as large as the base area of the component to be detached of the first group 2A. Nevertheless, each post 71 overlaps only with one detachable component.

The maximum size of the transfer body is thus no longer limited by the center spacing between neighboring components, but, by formation of a correspondingly large number of groups of components and suitable configuration of the sacrificial layer, may be significantly greater than the base area of the component to be detached, without the transfer body simultaneously overlapping with two detachable components.

In other words, the distance between detachable components lying closest together determines the maximum extent of the transfer body along this direction, rather than the center spacing of neighboring components per se.

Figure 5A:
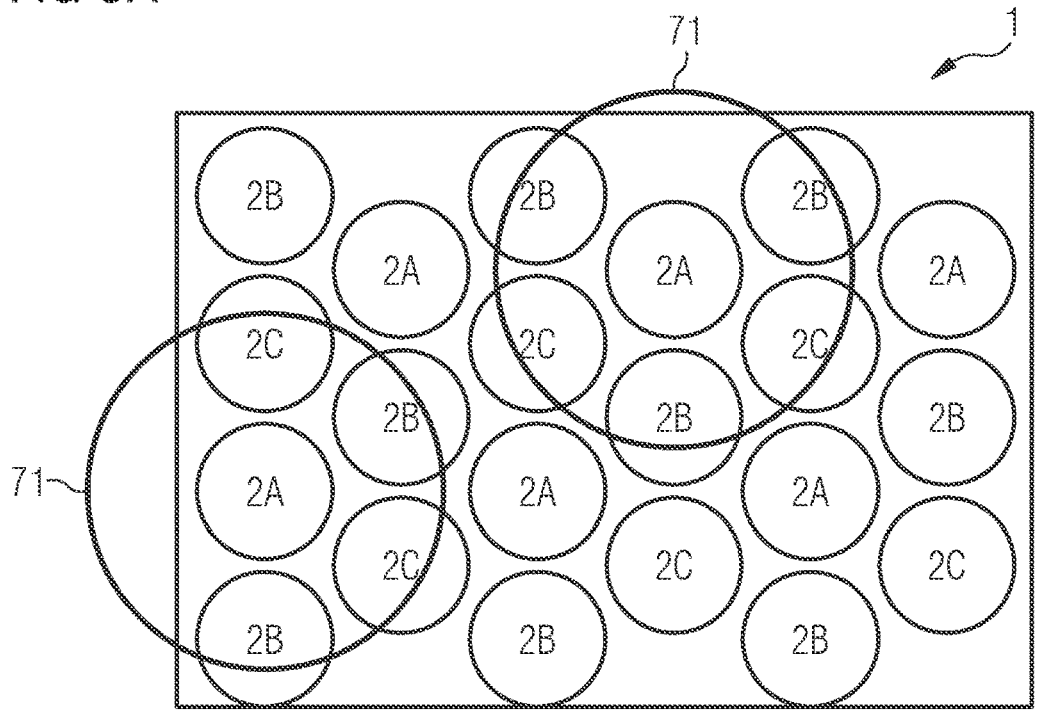
FIGS. 5A to 5C show an exemplary embodiment of a method for detaching components with the aid of intermediate steps in a schematic plan view.
Figure 5B:
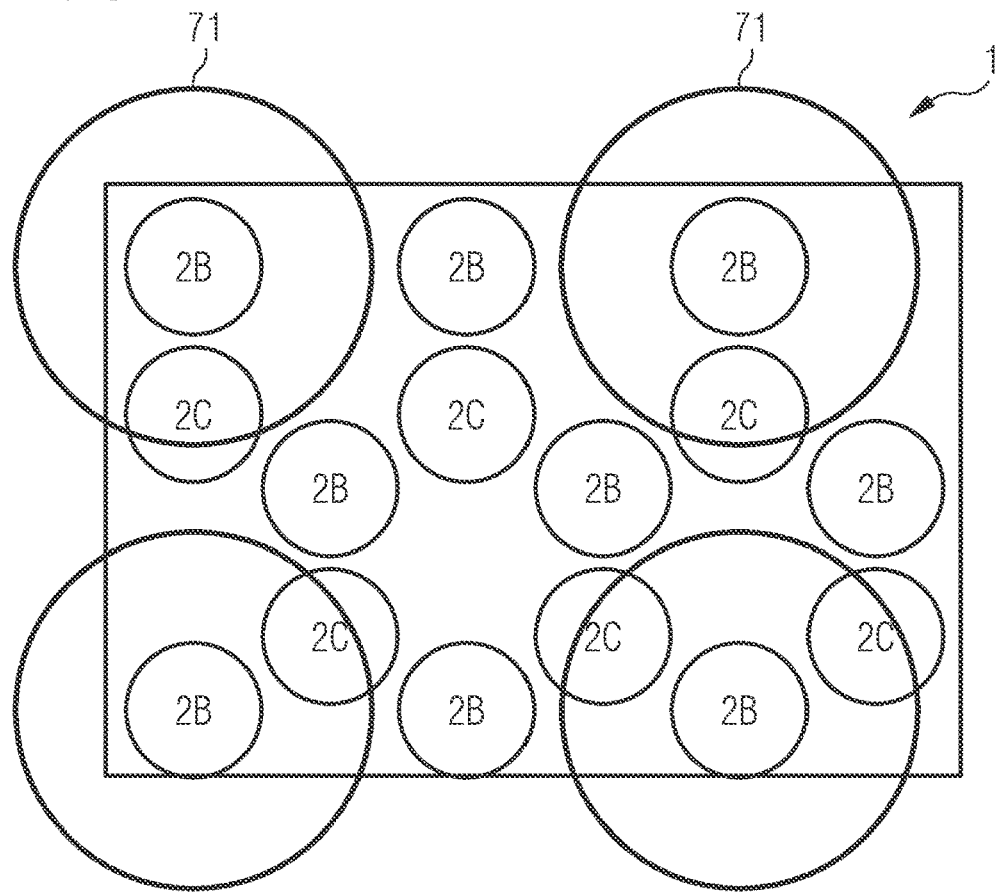
Figure 5C:
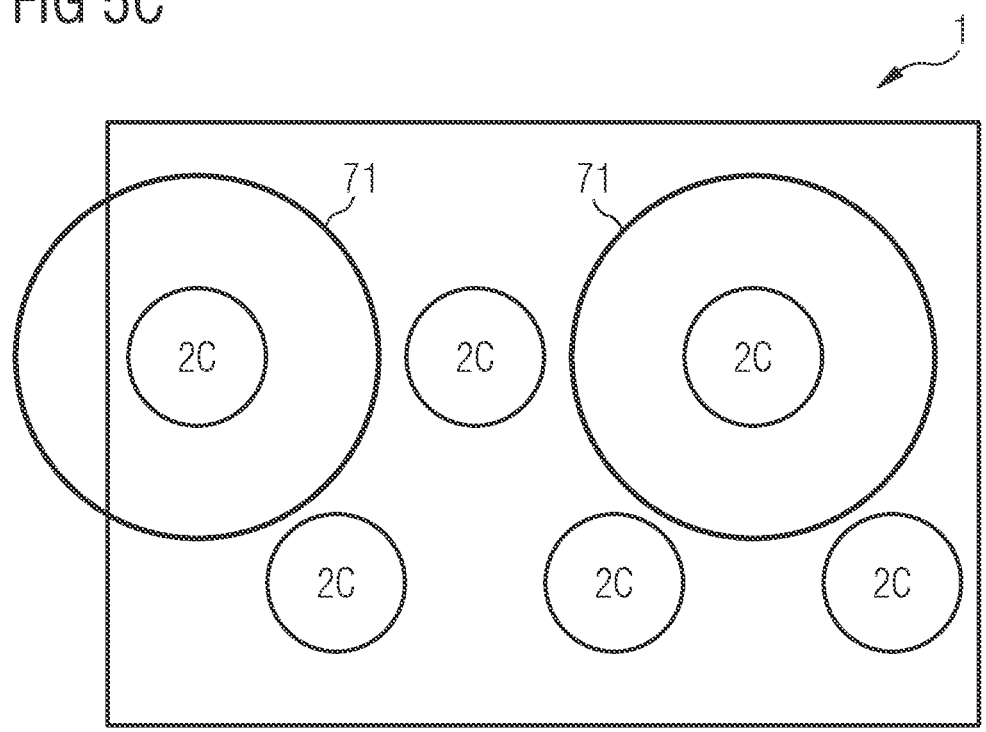

The exemplary embodiment of a method for detaching components, which is represented in FIGS. 5A to 5C, corresponds substantially to the exemplary embodiment described in connection with FIGS. 2A to 2F. In contrast thereto, the components are assigned to a first group 2A, a second group 2B and a third group 2C. The components of a group are respectively placed in a hexagonal array. The components of the first group 2A, of the second group 2B and of the third group 2C are respectively configured with circular base areas. By partial removal of the sacrificial layer 3, the components of the first group 2A may be made detachable so that they can be detached by means of a post

71. The maximum radius of the post 71 is given by the center spacing between two components of the same group less the radius of the components. In this case as well, the base area of the post 71 may be significantly larger than the base area of the component to be detached, without a post simultaneously overlapping with two detachable components.

FIG. 5B shows a method stage in which, after removal of further material of the sacrificial layer, the components of the second group 2B are detachable and are detached by means of posts 71. After a further etching step, the components of the third group 2C can be detached (FIG. 5C).

Figure 6A:
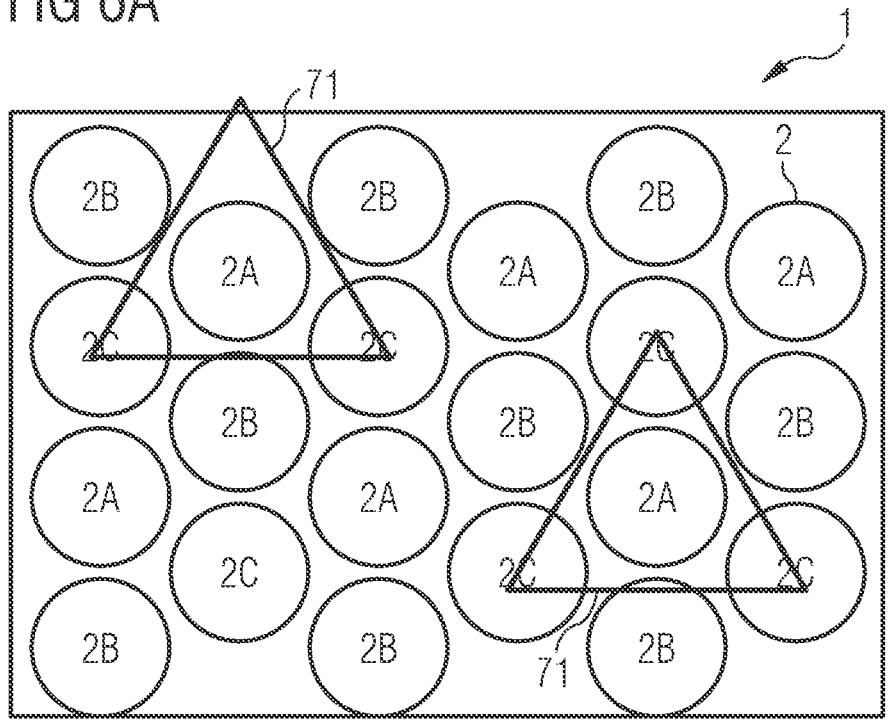
FIGS. 6A to 6C show an exemplary embodiment of a method for detaching components with the aid of intermediate steps in a schematic plan view.
Figure 6B:
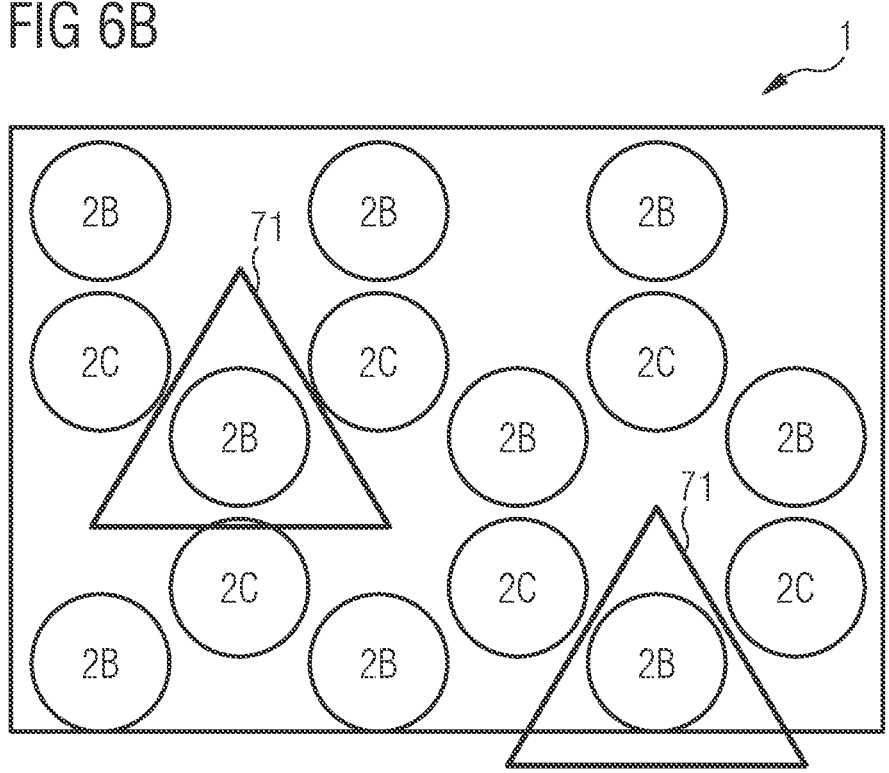
Figure 6C:
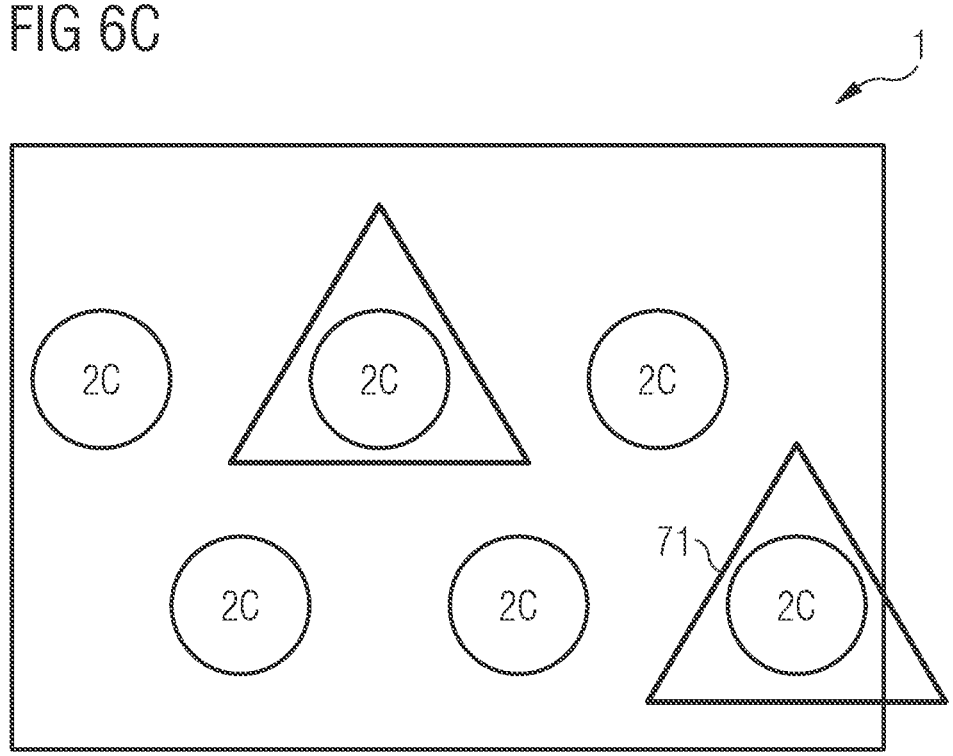

The exemplary embodiment shown in FIGS. 6A to 6C corresponds substantially to the exemplary embodiment described in connection with FIGS. 5A to 5C. In contrast thereto, the transfer body 7 and the components 2 have different base shapes to one another. Thus, the transfer body 7 is configured by way of example with a triangular base area. The components 2 have, by way of example, a circular base area.

Figure 7:
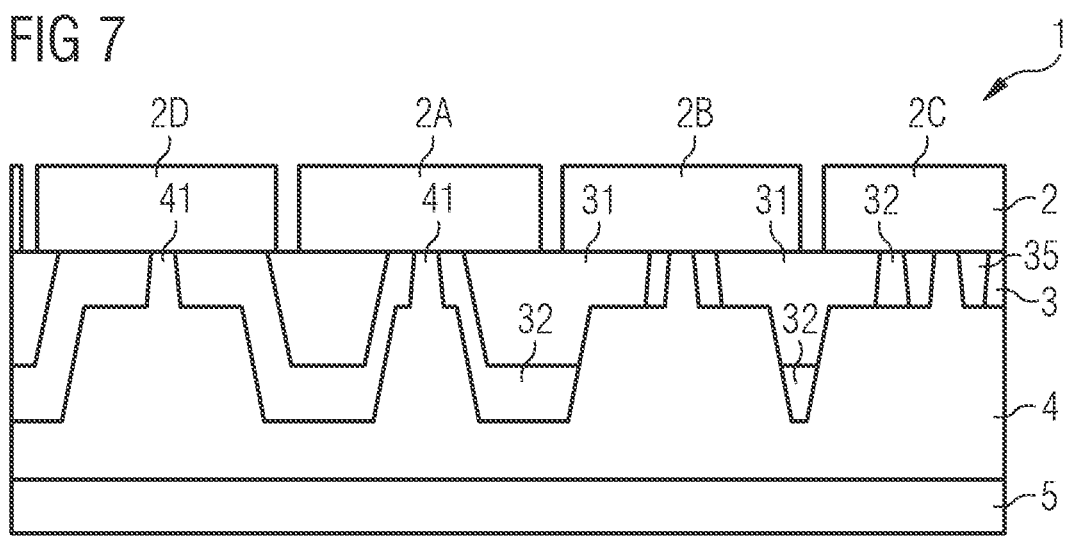
FIGS. 7, 8, 9 and 10 respectively show an exemplary embodiment of a component assembly in a schematic sectional view.

The exemplary embodiment of a component assembly 1, which is shown in FIG. 7, differs from the component assembly described in connection with FIG. 1 particularly in that the first partial layer 31 and the second partial layer 32 of the sacrificial layer 3 have different material compositions to one another.

For example, the first partial layer 31 contains silicon and the second partial layer 32 contains silicon nitride. By a chemical method which is selective with respect to the materials used, individual groups of components may be configured to be detachable with different ease. For example, silicon nitride is etched with a lower etching rate than silicon in a fluorine plasma or an $XeF_2$ plasma.

In the exemplary embodiment represented in FIG. 7, there is predominantly material of the first partial layer 31 below the components of the first group 2A and the components of the second group 2B. The thickness of the sacrificial layer 3 is greater below the components of the first group 2A than below the components of the second group 2B, so that the components of the first group 2A can be detached first.

Between the components of the third group 2C and the carrier 5, there is likewise material of the first partial layer 31 and material of the second partial layer 32. A portion of the first partial layer 31 is configured as an island 35, which is fully enclosed in the lateral direction by material of the second partial layer 32. The material of the island 35 can therefore be removed only when the surrounding material of the second partial layer 32 is already eroded. The components of the third group 2C can therefore be detached only after the components of the second group 2B.

Below the components of the group 2D, there is almost exclusively material of the second partial layer 32. These components can therefore be detached only after an additional etching step.

The method according to this exemplary embodiment thus uses both different etching rates due to different layer thicknesses and different etching rates due to different materials.

Figure 8:
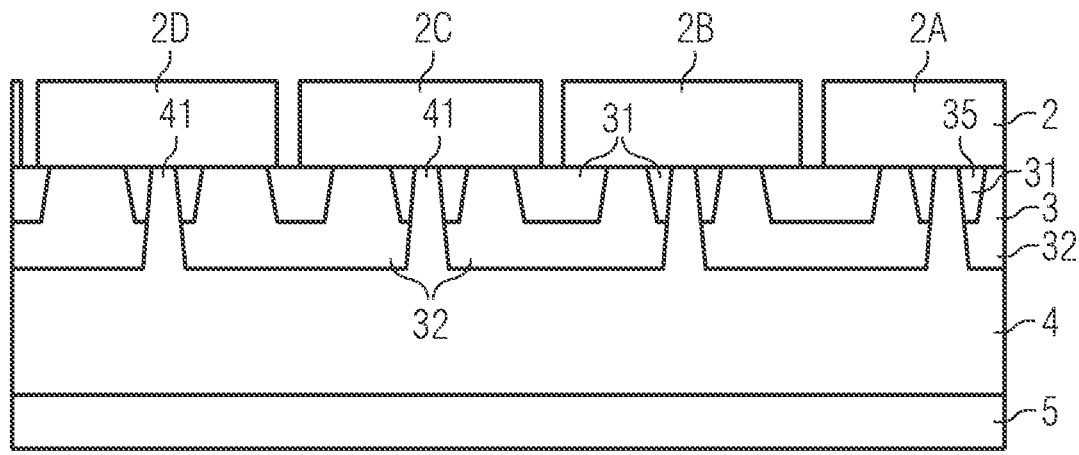

The exemplary embodiment represented in FIG. 8 corresponds substantially to the exemplary embodiment described in connection with FIG. 7. In contrast thereto, the thickness of the sacrificial layer 3 is the same for all groups of components 2A, 2B, 2C, 2D. The groups of components differ from one another in respect of the coverage with material of the first partial layer 31. The greater the coverage with material of the first partial layer is, the earlier the components of the associated group can be detached.

The supporting structures 41 are respectively surrounded by material of the first partial layer 31 in the region adjacent to the components 2.

Figure 9:
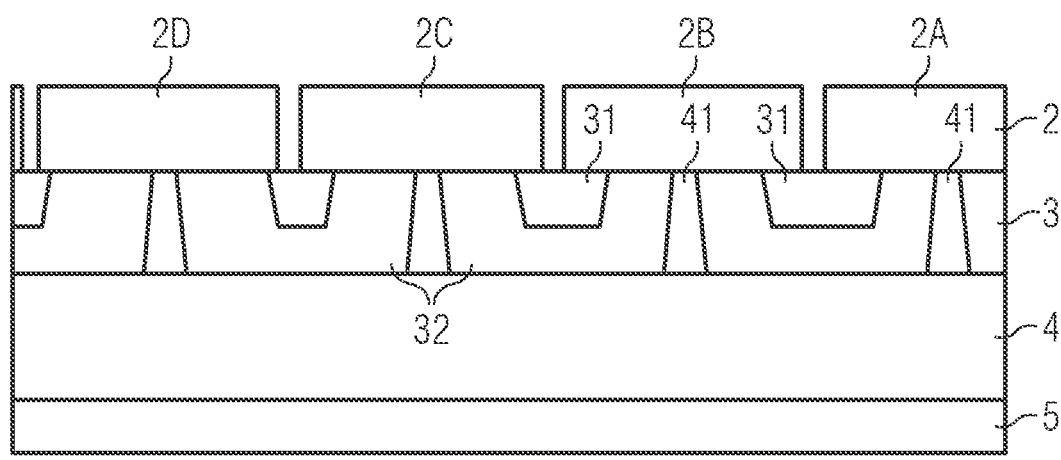

The exemplary embodiment represented in FIG. 9 corresponds substantially to the exemplary embodiment described in connection with FIG. 8. In contrast thereto, the supporting structures 41 are surrounded by material of the second partial layer 32. Again, the components of that group whose coverage with material of the first partial layer 31 is greatest, i.e. the components of the first group 2A, can be detached first.

Figure 10:
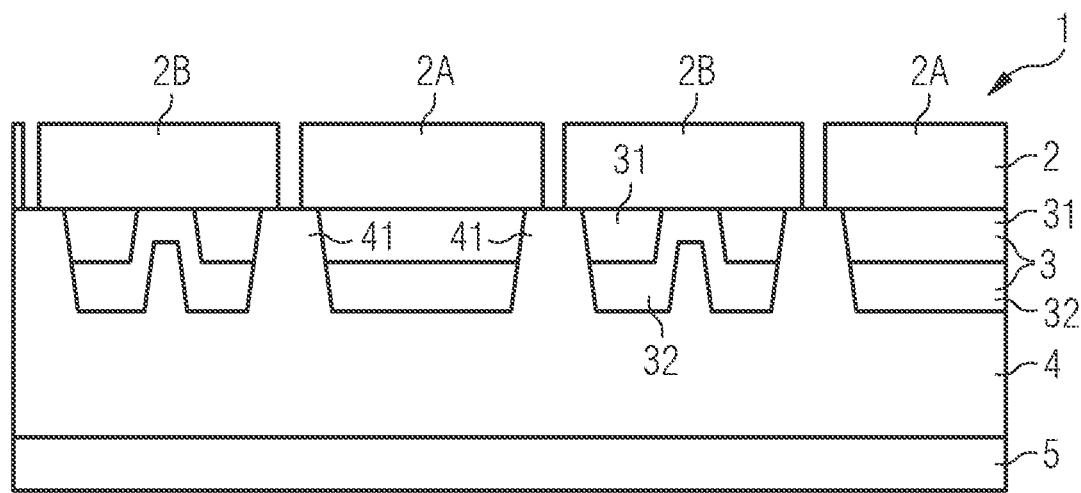

FIG. 10 shows an exemplary embodiment of a component assembly 1 in which the supporting structures 41 respectively overlap with at least two neighboring components 2. The supporting structures 41 in this case do not extend along the entire circumference of the components 2 in a plan view of the component assembly 41, so that the sacrificial layer 3 is regionally accessible for chemical material erosion in the intermediate spaces between neighboring components. With such a configuration of the supporting structure 41, the risk of tilting of the components 2 during the detachment by means of the transfer body may be substantially reduced. Expediently, each component overlaps with two or more mutually detached supporting structures.

Such a configuration of the supporting structures 41 may also be employed for the other exemplary embodiments.

Figure 11A:
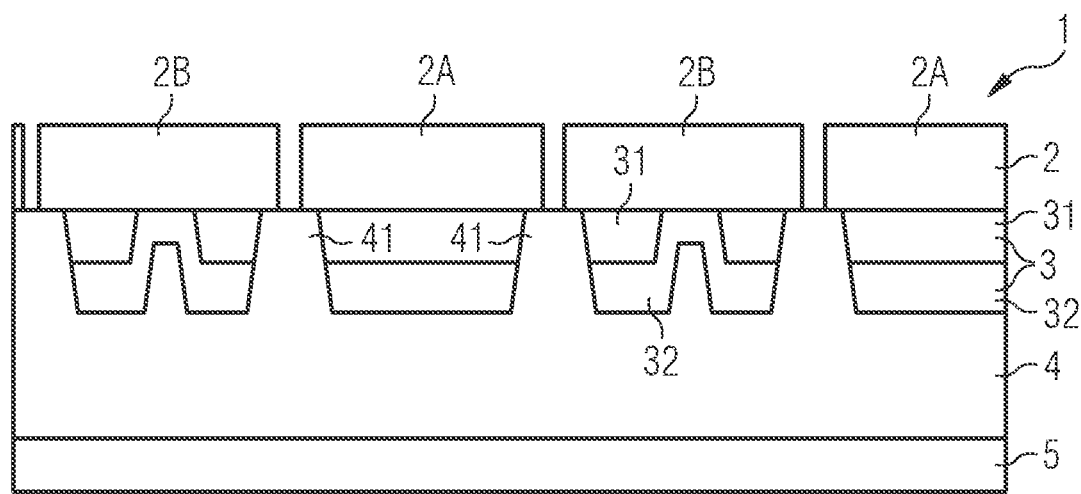

FIGS. 11A to 11C show an exemplary embodiment of a method for detaching components, a component assembly as described in connection with FIG. 10 being provided. Starting from intermediate spaces between neighboring components 2, in a first step material of the sacrificial layer 3 is removed, namely material of the first partial layer 31. The components of the first group 2A therefore become detachable. The removal of the first partial layer 31 preferably takes place by means of a chemical method which does not attack the second partial layer 32, or attacks it at least only with a greatly reduced etching rate in comparison with the first partial layer 31.

After the detachment of the components of the first group 2A, in a further step further material of the sacrificial layer, namely the material of the second partial layer 32, may be removed. The components of the second group 2B can therefore be detached and can correspondingly be transferred (FIG. 11C).

This method is particularly insensitive to variations in the etching rate or the etching duration, since a duration of the first etching step which is too long per se does not cause significant material erosion of the second partial layer, so that the components of the second group 2B reliably remain nondetachable when the components of the first group 2A are already detachable.

Figure 12:
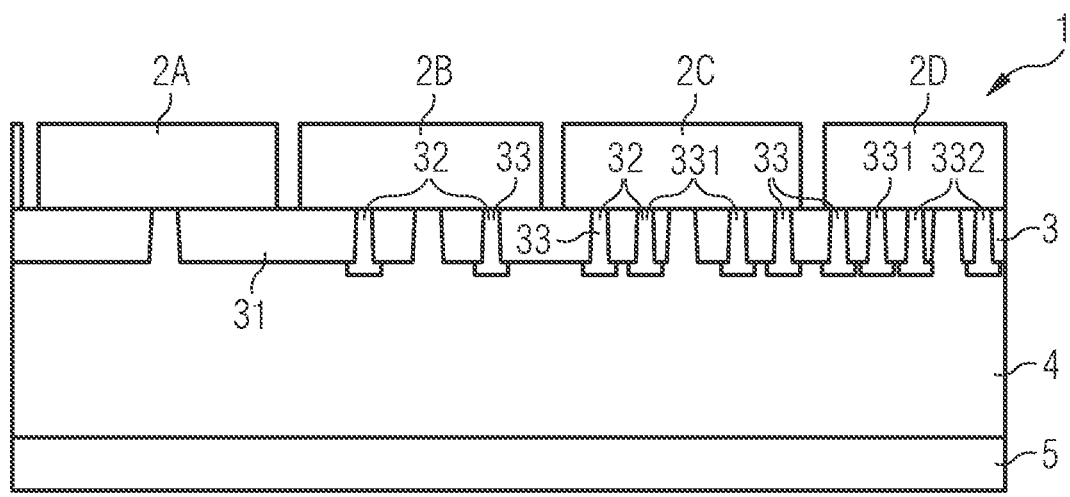
FIG. 12 shows an exemplary embodiment of a component assembly in a schematic sectional view.

The exemplary embodiment of a component assembly, which is represented in FIG. 12, corresponds substantially to the exemplary embodiment described in connection with FIG. 7. The groups of components 2A, 2B, 2C, 2D again differ in respect of their coverage with material of the first partial layer 31 and of the second partial layer 32. Between the components of the first group 2A and the connecting layer 4, there is only material of the first partial layer 31. Below the components of the second group 2B, there is an enclosing subregion 33 of the second partial layer 32, this subregion acting as a delay element. The enclosing subregion is, for example, configured in the form of a frame or in the form of a ring. While the material below the components of the first group 2A is being fully removed in a first etching step, the enclosing subregions 33 of the second partial layer below the components of the second group 2B, of the third group 2C and of the fourth group 2D can protect the laterally enclosed material of the first partial layer against material erosion, so that only the components of the first group can be detached. These enclosing components may subsequently be removed together with the material, adjacent thereto, of the first partial layer 31. In this way, the components of the second group 2B can be detached.

For the components of the third group 2C, there is a second enclosing subregion 331 within the enclosing subregion 33.

For the components of the fourth group 2D, there is a third enclosing subregion 332 within the second enclosing subregion.

By iterative repetition of the etching steps, these components may be configured to be detachable in succession.

With such an interleaving of structures which cannot be etched, or which can be etched only with difficulty, an order according to which the individual groups of components can be detached in succession may be defined reliably.

Figure 13A:
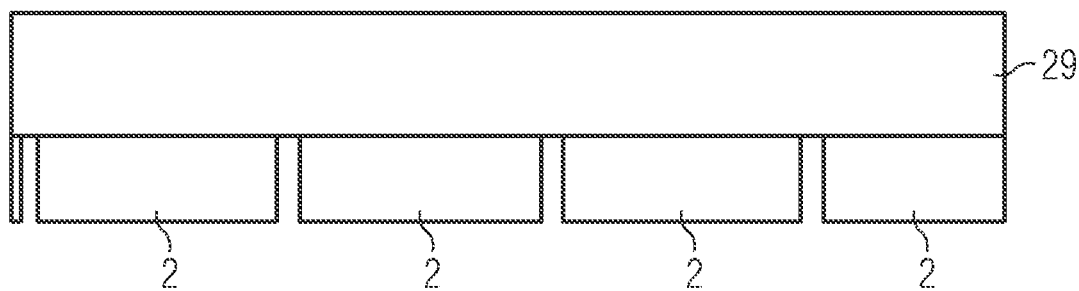
FIGS. 13A to 13D show a method for producing a component assembly with the aid of intermediate steps respectively represented in a schematic sectional view.

FIGS. 13A to 13D show an exemplary embodiment of a method for producing a component assembly, a component assembly as described in FIG. 1 being produced by way of example. The method is, however, also suitable in principle for the production of component assemblies according to the further exemplary embodiments. A multiplicity of components 2 are provided, for example on an initial carrier 29 (FIG. 13A).

Figure 13B:
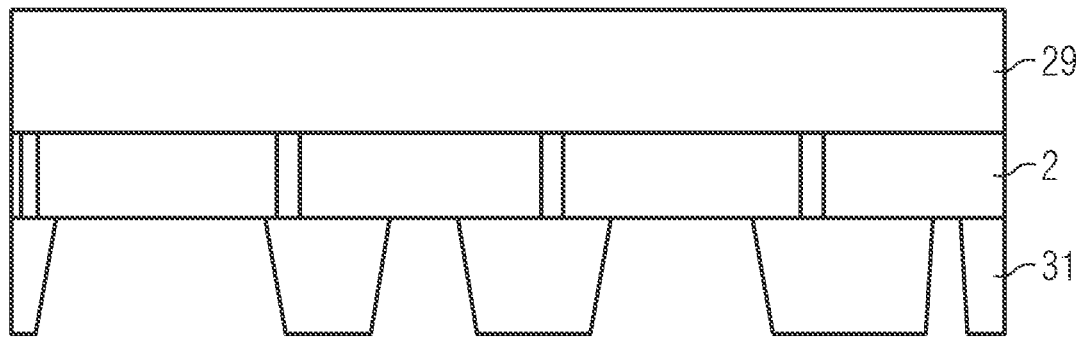
Figure 13C:
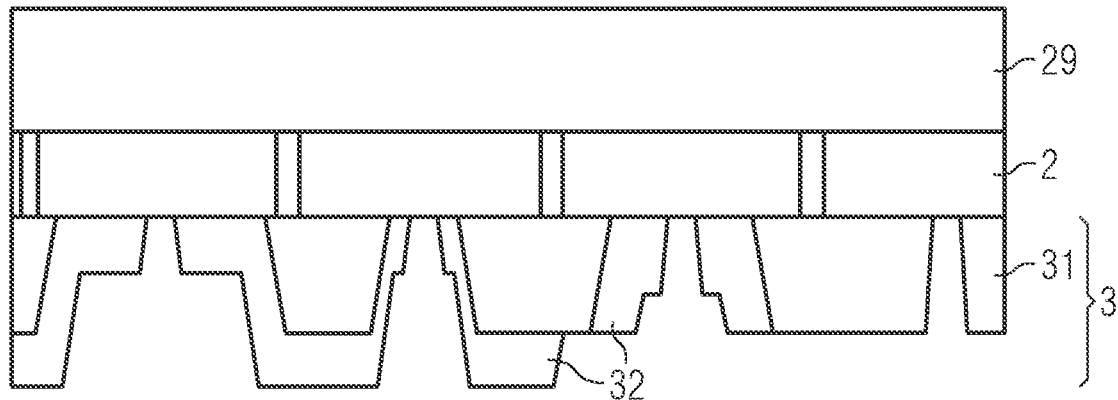

A sacrificial layer 3 is formed on the components 2. In the exemplary embodiment shown, this is done by forming a first partial layer 31 and a second partial layer 32 of the sacrificial layer (FIGS. 13B and 13C). The sacrificial layer is in this case configured in such a way that a coverage with the sacrificial layer differs for components of a first group 2A from that for components of a second group 2B.

In particular, the first partial layer 31 is configured in a lithographically structured fashion before the second partial layer 32 is applied.

The sacrificial layer 3 is applied onto the components for example by means of evaporation or sputtering, in which case different deposition methods may also be employed for different partial layers.

The components with the sacrificial layer 3 are subsequently secured on a carrier 5 by means of a connecting layer 4. For example, the material for the connecting layer 4 is applied in the fluid state onto the sacrificial layer 3 and fills the intermediate spaces of the sacrificial layer. Subsequently, the connecting layer 4 may if required be cured, for example thermally. The initial carrier 29 may then be removed.

Figure 13D:
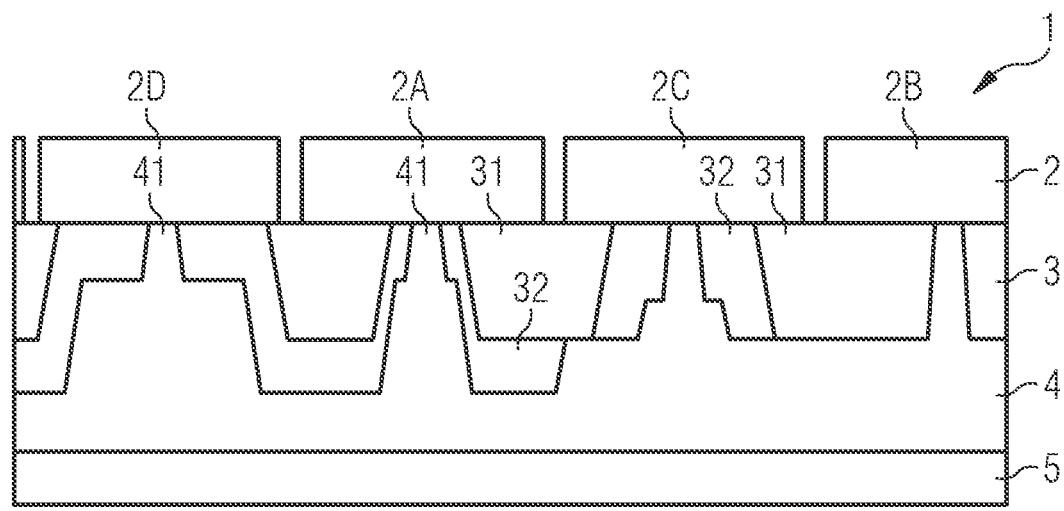

FIG. 13D shows the finished component carrier assembly 1.

The invention is not restricted by the description with the aid of the exemplary embodiments. Rather, the invention comprises any new feature and any combination of features, which in particular includes any combination of features in the patent claims, even if this feature or this combination itself is not explicitly specified in the patent claims or the exemplary embodiments.

The invention claimed is:

1. A component assembly comprising:
   a plurality of components;
   a carrier,
   wherein the components are secured on the carrier by a connecting layer,
   wherein, for each component, the connecting layer forms at least one supporting structure at which the connecting layer is adjacent to the component; and
   a sacrificial layer arranged regionally between the components and the connecting layer,
   wherein one portion of the components is assigned to a first group,
   wherein a further portion of the components is assigned to a second group, and
   wherein the components of the first group are different than the components of the second group in respect of a coverage with the sacrificial layer.

2. The component assembly as claimed in claim 1, wherein the components of the first group are arranged in a regular pattern.

3. The component assembly as claimed in claim 1, wherein at least some components of the first group only have nearest neighbors which do not belong to the first group of components along two mutually perpendicular spatial directions.

4. The component assembly as claimed in claim 1, wherein the components have a base area with a polygonal base shape and nearest neighbors of a component of the first group along all edges of this component do not belong to the first group of components.

5. The component assembly as claimed in claim 1, wherein at least some components of the first group are surrounded along an entire circumference by nearest neighbors which do not belong to the first group of components.

6. The component assembly as claimed in claim 1, wherein the components of the first group and of the second group differ in respect of an average thickness of the sacrificial layer between the respective components and the carrier.

7. The component assembly as claimed in claim 1, wherein the sacrificial layer comprises a first partial layer with a first material composition and a second partial layer with a second material composition different from the first material composition, and wherein the components differ from one another in respect of a coverage with material of the first partial layer.

8. The component assembly as claimed in claim 7, further comprising an island formed by the first partial layer, the island being surrounded along its lateral circumference to at least 80% by the second partial layer.

9. A method for detaching components from the component assembly, the method comprising:
   providing the component assembly as claimed in claim 1;
   regionally removing material of the sacrificial layer;
   detaching at least one component of the first group;
   removing further material of the sacrificial layer; and
   detaching at least one component of the second group.

10. The method as claimed in claim 9, wherein the components of the second group cannot be detached after regionally removing the material of the sacrificial layer and before removing further material of the sacrificial layer with a detachment force which is exerted for detaching the at least one component.

11. The method as claimed in claim 9, wherein detaching of the at least one components comprises a transfer body.

12. The method as claimed in claim 11, wherein the transfer body has a base area which is at least 20% larger than a base area of one of the detached components.

13. The method as claimed in claim 11, wherein a lateral principal extent axis of the transfer body is rotated with respect to a lateral principal extent axis of one of the detached components.

14. The method as claimed in claim 9, wherein the sacrificial layer comprises a first partial layer with a first material composition and a second partial layer with a second material composition different from the first material composition, and wherein regionally removing the material of the sacrificial layer comprises chemically removing the material of the sacrificial layer which is selective with respect to the first and second material compositions.

* * * * *